SR CROSS REFERENCE SEARCH ROOM
XR 3,414,779
Dec. 3, 1968 J. BOHM 3,414,779
INTEGRATED PARAMETRIC AMPLIFIER CONSISTING OF A MATERIAL WITH BOTH SEMICONDUCTIVE AND PIEZOELECTRIC PROPERTIES
Filed Dec. 8, 1965
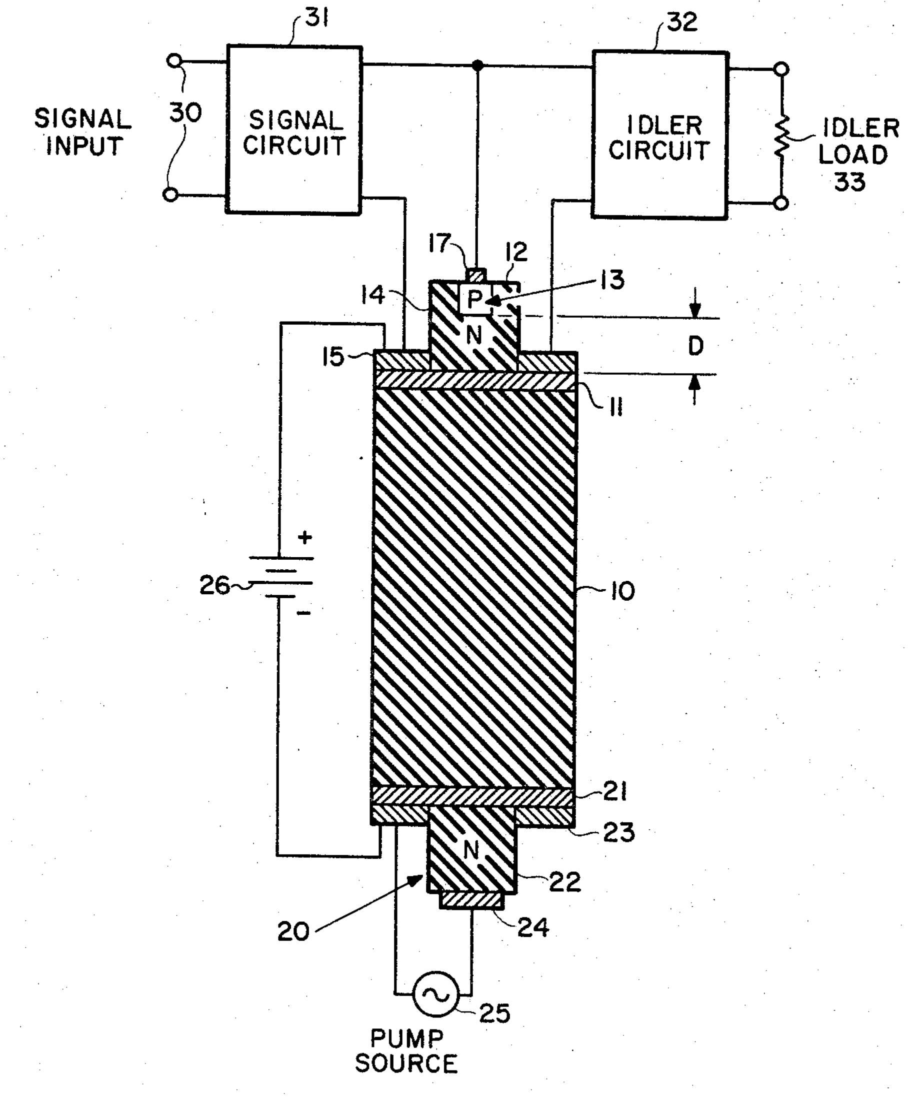
INVENTOR
JOHN BOHM
BY Curphey & Erickson
PATENT AGENTS 3,414,779
INTEGRATED PARAMETRIC AMPLIFIER CONSISTING OF A MATERIAL WITH BOTH SEMICONDUCTIVE AND PIEZOELECTRIC PROPERTIES John Bohm, Montreal, Quebec, Canada, assignor to Northern Electric Company Limited, Montreal, Quebec, Canada Filed Dec. 8, 1965, Ser. No. 512,311
6 Claims. (Cl. 317—234)

ABSTRACT OF THE DISCLOSURE

An integrated parametric amplifier which utilizes a piezoelectric acoustical transducer integrated with a non-linear capacitance p-n semiconductor junction that forms a varactor diode. Signals are coupled to the diode through the transducer from an acoustical wave propagating piezoelectric semiconductor medium and from associated electrical contacts.

This invention relates to an integrated transducer and semiconductor device which may advantageously be used as part of a parametric or tunnel diode amplifier.

In a parametric amplifier utilizing a non-linear capacitor or varactor diode as the active element, there are a plurality of tuned circuits which are coupled to the diode. For instance, a typical parametric amplifier includes a signal circuit, a pump circuit and an idler circuit through which the input, pump and idler signals, respectively, are coupled to and/or from the diode. At low frequencies, lump circuit components may be utilized to perform this function, while at very high frequencies and above coaxial or waveguide components are used. Many of these structures are expensive to build and complex in design. In addition, the varactor diode does not lend itself to being an integral part of a coaxial or waveguide structure, and must, therefore, be manufactured as a separate component which is mounted in the parametric amplifier.

Another type of structure which may be used as a tuned circuit and coupling element in a parametric amplifier is an electrical acoustical transducer. An electrical acoustical transducer has been described in the inventor's copending Canadian application Ser. No. 915,083 filed Oct. 28, 1964. In addition, other such transducers of this general type have been described by D. L. White in IRE Transactions on Ultrasonics Engineering, volume UE–9, No. 1, 1962, page 21; entitled, "The Depletion Layer Transducer"; and by N. F. Foster in IEEE Transactions on Ultrasonics Engineering, volume UE–10, No. 1, 1963, page 39; entitled, "The Performance of Dilatational Mode Cadmium Sulphide Diffusion Layer Transducers." Acoustical electrical transducers combined with a high resistivity propagation medium provide selectivity and electrical isolation and may also be readily adapted to provide impedance loading.

It is advantageous to simplify the structure and reduce the cost of a parametric amplifier utilizing electrical acoustical transducers, by integrating the varactor diode and at least one of the tuned circuits. Such a structure would not only result in reduced cost but also lend itself to better performance. However, in order to do this, it is necessary to utilize materials which are compatible for the transducer, the varactor diode, and an acoustical delay medium on which the transducer is constructed.

It has been discovered that such an integrated transducer and varactor diode or other semiconductor device can be constructed by utilizing the piezoelectric and semiconductor property of gallium arsenide and also the non-linear capacitor characteristics of a junction formed therefrom. Such a device comprises an electrical acoustical transducer coupled to an acoustical wave propagating medium and having one surface form part of a p-n junction of a non-linear varactor diode.

In a preferred embodiment of the invention, the device is formed by an epitaxial process which provides low loss coupling between the transducer and the acoustical wave propagating medium.

An example embodiment of the invention will now be described with reference to the accompanying drawing which illustrates a cross-sectional view of an integrated transducer, propagation medium and varactor diode forming part of a pump circuit in a parametric amplifier.

In the figure, the integrated transducer and varactor diode comprise an acoustical wave propagating piezoelectric semiconductor medium 10 having a conductive semiconductor layer 11 formed on one surface thereof. A high resistivity piezoelectric layer 12 of n-type semiconductor material is deposited on the conductive layer 11. Next a p-type impurity is diffused into part of the layer 12 so as to form a planar low resistivity semiconductor portion 13 thereon. The interface of the layer 12 and the portion 13 form the p-n junction 14 of the varactor diode. Finally, ohmic contacts 15, and 17, are formed on the conductive layer 11 and the region 13, respectively. The contact 15 is preferably annular and surrounds the layer 12.

In a preferred embodiment, the medium 10, the layers 11 and 12 and the region 13 are all gallium arsenide. By forming the layers 11 and 12 by epitaxial growth from this material, low coupling losses between the transducer and the medium 10 may be obtained. Gallium arsenide has been used since it is one material which exhibits both piezoelectric and non-linear capacity characteristics thus lending itself to an integrated device.

In a piezoelectric material, longitudinal or shear waves can be generated if voltages are applied in the piezoelectrically active directions. In the case of gallium arsenide, longitudinal waves can be generated if voltage is applied along the (111) crystal orientation and shear waves if it is applied in the (110) direction.

With reference to the Figure, if the medium 10 is oriented in the X direction, and is piezoelectrically active in that direction any acoustical wave propagation in that direction will be affected by the applied signal voltage between the contacts 15 and 17. When certain conditions are satisfied amplification of the acoustical wave will take place. If the layer 12 is of epitaxial gallium arsenide, and it is deposited in the (111) direction, longitudinal waves will be generated; if it is in the (110) direction, shear waves will be produced. In order to obtain a high Q for the transducer, the layer 12 must be of high resistivity. Because, in the preferred embodiment, the layer 12 is epitaxially deposited on the layer 11, and the layer 11 on the propagation medium 10 there is virtually perfect mechanical matching between the layers 11 and 12, and the medium 10 with consequent high acoustical transfer efficiency.

It can be seen by giving the layer 12 the same type of doping as the layer 11, no junction and therefore no voltage dependent depletion layer can exist. When the layer 12 is epitaxially deposited, its resistivity can be accurately controlled and kept constant. The thickness of layer 12 is made equal to half the acoustical wavelength. There is no theoretical limit to the thickness of the layer 12 and thus the low frequency operation may be extended as far as desired. The high frequency performance would be limited by the resonance of the thinnest layer 12 which can be deposited and this thickness will become less as epitaxial construction layer techniques improve. The layer 11 need not be deposited epitaxially but could also be formed by diffusion of a doping impurity into the medium 10. It forms a low resistivity contact area to transducer 12 and propagation medium 10.

From an acoustical point of view the transducer is not disturbed by the varactor diode and will generate a voltage across the contacts 15 and 17 if acoustical excitation is present in the medium 10. In order to avoid high series resistance and therefore reduction in the Q of the diode, the distance D from the p-n junction 14 to the layer 11 should be minimized.

If the transducer forms part of an acoustical amplifier, a second transducer generally 20 is coupled to the opposite end of the medium 10 and comprises a conductive semiconductor layer 21 on which there is deposited a high resistivity piezoelectric semiconductor layer 22. Ohmic contacts 23 and 24 are then deposited on the conductive layer 21 and the high resistivity layer 22, respectively. Again the transducer 20 is constructed from epitaxial gallium arsenide to provide the advantages previously set forth. The transducer is coupled to a pump source 25 by conventional techniques which may include either coaxial or waveguide components. A source of direct current 26 is applied between the ohmic contacts 15 and 23 and provides a D-C drift field across the medium 10. Adjustment of the voltage from the source 26 will result in a net gain or loss of the signal through the medium. This provides a simple means of controlling the amount of pump power from the source 25 reaching the junction 14 of the varactor diode. If the medium 10 has a high electrical resistivity, it provides isolation between the pump source 25 and the diode formed from the junction 14.

While the transducers transform harmonics of the fundamental signal frequencies also, this does not affect the operation of the parametric amplifier since the input, idler and pump signal frequencies have generally no harmonic relationship with each other.

In a completed parametric amplifier, an input signal is coupled to and from input connections 30 through a signal circuit 31 to the varactor diode. In addition, an idler signal generated by the pump and input signals is coupled from the varactor diode through an idler circuit 32 to an idler load 33. Both the signal circuit 31 and the idler circuit 32 may be constructed by electrical acoustical techniques or by using conventional coaxial or waveguide components.

While the described embodiment uses an external pump source, this can be eliminated. By varying the voltage from the source 26, gains larger than one can be achieved thereby forming an internal oscillator where the oscillation frequency is determined by the transducers. Such an oscillator can be incorporated into the present set up. The only modification would be the elimination of external pump source 25.

What is claimed is:

1. An integrated electrical acoustical transducer and semiconductor device comprising an acoustical wave propagating piezoelectric semiconductor medium; a conductive semiconductor layer on one face of said medium; a high resistivity piezoelectric semiconductor layer on said conductive semiconductor layer; a low resistivity semiconductor region on the high resistivity piezoelectric layer of opposite conductivity type thereto, so as to form a p-n junction; and ohmic contacts on said conductive semiconductor layer, and on said low resistivity semiconductor region.

2. A device as defined in claim 1 in which the acoustical wave propagating piezoelectric semiconductor medium, the high resistivity semiconductor layer, and the low resistivity semiconductor region are of the same semiconductor material.

3. A device as defined in claim 2 in which said material is gallium arsenide.

4. A device as defined in claim 1, in which at the junction of the high resistivity piezoelectric semi conductor layer and the low resistivity semiconductor region, there is formed a varactor diode.

5. A device as defined in claim 1, additionally comprising a further electrical acoustical transducer on a face of said medium opposed said one face, and means for applying a source of voltage between said faces of the medium.

6. A device as defined in claim 1 additional comprising a further ohmic contact on a face of said medium opposed said one face, and means for applying a source of voltage between the ohmic contact on said conductive layer and the further ohmic contact.

References Cited

UNITED STATES PATENTS

| | | | |
|---|---|---|---|
| 3,185,935 | 5/1965 | White | 333—30 |
| 3,231,796 | 1/1966 | Shombert | 317—235 |
| 3,240,962 | 3/1966 | White | 310—8 |
| 3,277,698 | 10/1966 | Mason | 73—88.5 |
| 3,314,035 | 4/1967 | Sanchez | 338—68 |
| 3,319,140 | 5/1967 | Toussaint, et al. | 317—235 |
| 3,330,957 | 7/1967 | Runnels | 250—199 |

JOHN W. HUCKERT, *Primary Examiner*.

R. SANDLER, *Assistant Examiner*.